(12) United States Patent
Zhang

(10) Patent No.: US 12,471,435 B2
(45) Date of Patent: Nov. 11, 2025

(54) LIGHT EMITTING DEVICE, MANUFACTURING METHOD THEREOF, DISPLAY SUBSTRATE AND DISPLAY APPARATUS

(71) Applicants: Beijing BOE Technology Development Co., Ltd., Beijing (CN); BOE TECHNOLOGY GROUP CO., LTD., Beijing (CN)

(72) Inventor: Xiaoyuan Zhang, Beijing (CN)

(73) Assignee: Beijing BOE Technology Development Co., Ltd., Beijing (CN)

(*) Notice: Subject to any disclaimer, the term of this patent is extended or adjusted under 35 U.S.C. 154(b) by 0 days.

(21) Appl. No.: 18/028,560

(22) PCT Filed: Apr. 29, 2022

(86) PCT No.: PCT/CN2022/090137
§ 371 (c)(1),
(2) Date: Mar. 26, 2023

(87) PCT Pub. No.: WO2023/206319
PCT Pub. Date: Nov. 2, 2023

(65) Prior Publication Data
US 2024/0365579 A1    Oct. 31, 2024

(51) Int. Cl.
*H10K 50/16* (2023.01)
*H10K 50/115* (2023.01)
(Continued)

(52) U.S. Cl.
CPC ........... *H10K 50/16* (2023.02); *H10K 50/115* (2023.02); *H10K 71/12* (2023.02); *H10K 59/35* (2023.02); *H10K 85/113* (2023.02); *H10K 85/1135* (2023.02); *H10K 85/636* (2023.02); *H10K 85/654* (2023.02); *H10K 85/655* (2023.02); *H10K 2102/311* (2023.02)

(58) Field of Classification Search
None
See application file for complete search history.

(56) References Cited

U.S. PATENT DOCUMENTS

2016/0149150 A1    5/2016 Seo et al.

FOREIGN PATENT DOCUMENTS

| CN | 105845837 B | 5/2018 |
|---|---|---|
| CN | 109980109 A | 7/2019 |

(Continued)

*Primary Examiner* — Anthony Ho
(74) *Attorney, Agent, or Firm* — HOUTTEMAN LAW LLC

(57) ABSTRACT

A light emitting device, including a first electrode, a first carrier transport layer, a light emitting layer, a second carrier transport layer, and a second electrode, in this order, where a rate of injecting first carriers into the light emitting layer by the first carrier transport layer is greater than a rate of injecting second carriers into the light emitting layer by the second carrier transport layer; the light emitting device further includes an interface layer on a side of the light emitting layer close to the second carrier transport layer; the interface layer includes a first material, which is capable of reacting with the first carriers under a preset condition, such that an energy level of the first material is changeable; and a transport rate of the first carriers in the interface layer is less than a transport rate of the first carriers in the first carrier transport layer.

20 Claims, 6 Drawing Sheets

(51) Int. Cl.
*H10K 71/12* (2023.01)
*H10K 59/35* (2023.01)
*H10K 85/10* (2023.01)
*H10K 85/60* (2023.01)
*H10K 102/00* (2023.01)

(56) References Cited

FOREIGN PATENT DOCUMENTS

| | | | |
|---|---|---|---|
| CN | 110323347 | A | 10/2019 |
| CN | 111384256 | A | 7/2020 |
| CN | 111540837 | A | 8/2020 |
| CN | 112018254 | A | 12/2020 |
| CN | 112038460 | A | 12/2020 |
| CN | 112201759 | A | 1/2021 |
| CN | 112750954 | A | 5/2021 |
| CN | 113258013 | A | 8/2021 |
| CN | 113568235 | A | 10/2021 |
| CN | 113838986 | A | 12/2021 |
| EP | 3716349 | A1 | 9/2020 |
| JP | 2016095503 | A | 5/2016 |
| TW | 201205174 | A | 2/2012 |

⊖ Electron ⊕ Hole

LIGHT EMITTING DEVICE, MANUFACTURING METHOD THEREOF, DISPLAY SUBSTRATE AND DISPLAY APPARATUS

TECHNICAL FIELD

The present disclosure relates to the field of display technology, and in particular, to a light emitting device, a method of manufacturing a light emitting device, a display substrate and a display apparatus.

BACKGROUND

A self-luminous display product includes a light emitting device such as an OLED (Organic Light emitting Diode) or a QLED (Quantum Dot Light emitting Diode). The light emitting device includes an anode, a cathode and a light emitting layer located between the anode and the cathode. The light emitting principle of the light emitting device is as follows: holes injected from the anode and electrons injected from the cathode are combined in the light emitting layer to form excitons, which excite light emitting molecules, and the excited light emitting molecules emit visible light through radiation relaxation. A balance between the injection of electrons and the injection of holes has an important influence on the performance of the light emitting device.

SUMMARY

The embodiments of present disclosure provide a light emitting device, a method of manufacturing a light emitting device, a display substrate and a display apparatus.

In a first aspect, the present disclosure provides a light emitting device including a first electrode, a second electrode, a light emitting layer, a first carrier transport layer and a second carrier transport layer, where the first electrode and the second electrode are opposite to each other, the light emitting layer is between the first electrode and the second electrode, the first carrier transport layer is between the first electrode and the light emitting layer, and the second carrier transport layer is between the second electrode and the light emitting layer; one of the first carrier transport layer and the second carrier transport layer is an electron transport layer, and the other of the first carrier transport layer and the second carrier transport layer is a hole transport layer; a rate of injecting first carriers into the light emitting layer by the first carrier transport layer is greater than a rate of injecting second carriers into the light emitting layer by the second carrier transport layer; and the light emitting device further includes an interface layer on a side of the light emitting layer close to the second carrier transport layer and in contact with the light emitting layer; a material of the interface layer includes a first material, which is capable of reacting with the first carriers under a preset condition, such that an energy level of the first material is changeable; and a transport rate of the first carriers in the interface layer is less than a transport rate of the first carriers in the first carrier transport layer.

In some embodiments, the preset condition includes being applied with a certain voltage or being excited by irradiation of a light in a specific wavelength band.

In some embodiments, the preset condition includes being applied with the certain voltage; and the first material is capable of undergoing a reverse change of energy level upon being applied with a certain reverse voltage.

In some embodiments, the interface layer has a thickness in a range of 3 nm to 25 nm.

In some embodiments, the first carriers are electrons, the second carriers are holes, and a material of the interface layer includes at least one of viologen, polythiophene, tungsten trioxide, molybdenum trioxide, vanadium pentoxide, niobium oxide, titanium dioxide, and bismuth oxide.

In some embodiments, the first carriers are holes, the second carriers are electrons, and a material of the interface layer includes at least one of oxides and hydrated oxides of a group VIII metal element, and/or at least one of organic materials of triphenylamines and fulvalene.

In some embodiments, the interface layer is between the first carrier transport layer and the light emitting layer; or the interface layer and the second carrier transport layer are formed into a doped layer, the doped layer includes a matrix and a second carrier transport material doped in the matrix, and a material of the matrix includes the first material.

In some embodiments, the first material includes poly(3,4-ethylenedioxythiophene), and the first carrier transport material includes NiO nanoparticles.

In some embodiments, the light emitting layer is an organic electroluminescent layer or a quantum dot light emitting layer.

In a second aspect, the present disclosure provides a display substrate including a plurality of light emitting devices, at least one of which employs the light emitting device described above.

In some embodiments, each of the plurality of light emitting devices employs the light emitting device described above, the plurality of light emitting devices includes a red light emitting device, a green light emitting device, and a blue light emitting device, where thicknesses of the interface layers in the red light emitting device, the green light emitting device and the blue light emitting device are different from each other; and/or materials of the interface layers in the red light emitting device, the green light emitting device and the blue light emitting device are different from each other.

In a third aspect, the present disclosure provides a method of manufacturing a light emitting device, including:

forming a first electrode, a second electrode, a light emitting layer, a first carrier transport layer and a second carrier transport layer, where the first electrode and the second electrode are opposite to each other, the light emitting layer is between the first electrode and the second electrode, the first carrier transport layer is between the first electrode and the light emitting layer, and the second carrier transport layer is between the second electrode and the light emitting layer; one of the first carrier transport layer and the second carrier transport layer is an electron transport layer, and the other of the first carrier transport layer and the second carrier transport layer is a hole transport layer; a rate of injecting first carriers into the light emitting layer by the first carrier transport layer is greater than a rate of injecting second carriers into the light emitting layer by the second carrier transport layer; and the method further includes: forming an interface layer on a side of the light emitting layer close to the second carrier transport layer and in contact with the light emitting layer, where a material of the interface layer includes a first material, which is capable of reacting with the first carriers under a preset condition, such that an energy level of the first material is changeable; and a transport rate of the first carriers in the interface layer is less than a transport rate of the first carriers in the first carrier transport layer.

In a fourth aspect, the present disclosure provides a display device, including the display substrate described above.

BRIEF DESCRIPTION OF DRAWINGS

The accompanying drawings, which are included to provide a further understanding of the present disclosure and constitute a part of this specification, serve to explain the present disclosure together with the following detailed description, but do not constitute a limitation of the present disclosure. In the drawings.

DETAIL DESCRIPTION OF EMBODIMENTS

Figure 1:
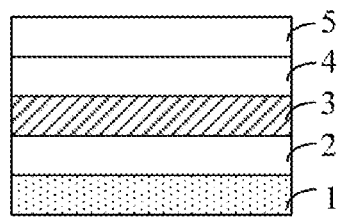
FIG. 1 is a schematic diagram of a light emitting device provided in an example.

The embodiments of the present disclosure will be described in detail below with reference to the accompanying drawings. It should be understood that the embodiments described herein are only intended to illustrate and explain the present disclosure, but not to limit the present disclosure.

In order to make the objects, technical solutions and advantages of the embodiments of the present disclosure more apparent, the technical solutions of the embodiments of the present disclosure will be clearly and completely described below with reference to the drawings of the embodiments of the present disclosure. Obviously, the described embodiments are some, but not all, embodiments of the present disclosure. All other embodiments, which can be derived by one of ordinary skill in the art from the described embodiments of the present disclosure without creative efforts, are within the protection scope of the present disclosure.

The term used herein to describe embodiments of the present disclosure is not intended to limit and/or define the scope of the present disclosure. For example, unless otherwise defined, a technical or scientific term used herein shall have the ordinary meaning as understood by one of ordinary skill in the art to which the present disclosure belongs. It should be understood that the terms "first", "second", and the like, as used in the present disclosure, do not denote any order, quantity, or importance, but rather are used to distinguish one element from another. The singular form "a", "an", or "the" and the like does not denote a limitation of quantity, but rather denotes the presence of at least one, unless the context clearly dictates otherwise. The word "comprising" or "comprises", and the like, means that the element or item appearing in front of the word "comprising" or "comprises" includes the element or item listed after the word "comprising" or "comprises" and its equivalents, and does not exclude other elements or items. The term "connected" or "coupled" and the like is not restricted to a physical or mechanical connection, but may include an electrical connection, whether direct or indirect. The terms "upper", "lower", "left", "right", and the like are used merely to indicate relative positional relationships, which may also change accordingly when the absolute position of the object being described changes.

In the following description, when an element or layer is referred to as being "on" or "connected to" another element or layer, it may be directly on, connected to, or intervening elements or layers may be present. However, when an element or layer is referred to as being "directly on" or "directly connected to" another element or layer, there are no intervening elements or layers present. The term "and/or" includes any and all combinations of one or more of the associated listed items.

As used herein, the term "about" or "approximately" means that the stated value and a value within an acceptable range of deviation for the particular value are included, where the acceptable range of deviation is determined by one of ordinary skill in the art in view of the measurement in question and the error associated with the measurement of the particular quantity (i.e., the limitations of the measurement system). For example, the term "about" may mean that a difference with respect to the stated value is within one or more standard deviations, or within ±30%, ±20%, ±10%, ±5% of the stated value.

Hereinafter, a Highest Occupied Molecular Orbital ("HOMO") energy level and a Lowest Unoccupied Molecular Orbital (LUMO) energy level each represent an absolute value from vacuum. Further, when the HOMO or LUMO energy level is referred to as 'deep', 'high', or 'large', the HOMO or LUMO energy level has a great absolute value with respect to '0 eV', i.e., a vacuum level, and when the HOMO or LUMO energy level is referred to as 'shallow', 'low', or 'small', the HOMO or LUMO energy level has a low absolute value from '0 eV', i.e., the vacuum level.

A self-luminous display product includes a light emitting device such as an OLED (Organic Light emitting Diode) or a QLED (Quantum Dot Light emitting Diode). FIG. 1 is a schematic diagram of a light emitting device provided in an example. As shown in FIG. 1, the light emitting device includes an anode 1, a cathode 5 and an electron transport layer 4, a light emitting layer 3, and a hole transport layer 2 located between the anode 1 and the cathode 5. The light emitting principle of the light emitting device is as follows: holes injected from the anode 1 and electrons injected from the cathode 2 are combined in the light emitting layer 4 to form excitons, the excitons excite light emitting molecules, and the excited light emitting molecules emit visible light through radiation relaxation. A balance between the injection of electrons and the injection of holes has an important influence on the performance of the light emitting device.

Figure 2:
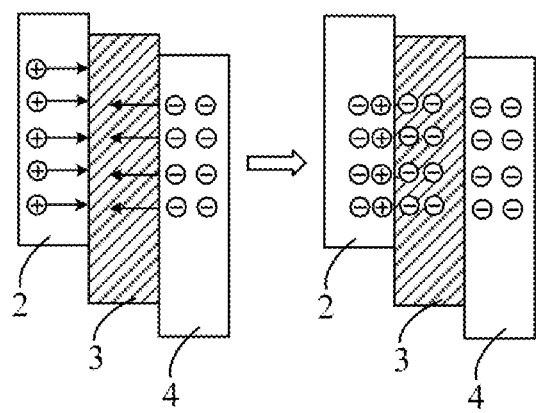
FIG. 2 is a schematic diagram illustrating carrier transport in a light emitting device provided in an example.

Taking a QLED device as an example, in some QLED devices, the electron transport layer 4 is made of a material such as ZnO, ZnMgO, ZnAlOx, or the like, which have high electron mobility and a good energy level matching effect with the quantum dot light emitting layer, so that electrons in the light emitting device are majority carriers. FIG. 2 is a schematic diagram of a carrier transport in the light emitting device provided in an example. As shown in FIG. 2, when the electrons in the light emitting device are majority electrons, a large number of electrons may pass through the light emitting layer 3 and reach an interface between the light emitting layer 3 and the hole transport layer 2, so that the light emitting layer 3 is charged to cause Auger recombination, thereby reducing current efficiency and lifetime of the light emitting device.

Figure 3A:
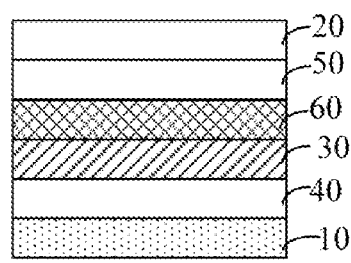
FIG. 3A is a schematic diagram of a light emitting device provided in some embodiments of the present disclosure.

In order to solve the above problems, an embodiment of the present disclosure provide a light emitting device. FIG. 3A is a schematic diagram of a light emitting device provided in some embodiments of the present disclosure. As shown in FIG. 3A, the light emitting device includes a first electrode 10, a second electrode 20, a light emitting layer 30, a first carrier transport layer 40, and a second carrier transport layer 50.

The first electrode 10 and the second electrode 20 are arranged opposite to each other, one of the first electrode 10 and the second electrode 70 may be a cathode, and the other of the first electrode 10 and the second electrode 70 may be an anode.

The light emitting layer 30 is located between the first electrode 10 and the second electrode 20. Optionally, the light emitting device is an OLED device, in which case the light emitting layer 40 is made of an organic light emitting material. Alternatively, the light emitting device is a QLED device, in which case the light emitting layer 40 is made of a quantum dot light emitting material.

The first carrier transport layer 40 is located between the first electrode 10 and the light emitting layer 30, and the second carrier transport layer 50 is located between the second electrode 20 and the light emitting layer 30. One of the first carrier transport layer 40 and the second carrier transport layer 50 is an electron transport layer, and the other of the first carrier transport layer 40 and the second carrier transport layer 50 is a hole transport layer. The first carrier transport layer 40 injects first carriers into the light emitting layer 30 at a rate greater than a rate of the second carrier transport layer 50 injecting second carriers into the light emitting layer 30.

It should be stated that, that the injection rate of injecting the first carriers into the light emitting layer 30 by the first carrier transport layer 40 is greater than the injection rate of injecting the second carriers into the light emitting layer 30 by the second carrier transport layer 50, means that a quantity of the first carriers injected into the light emitting layer 30 by the first carrier transport layer 40 per unit time is greater than a quantity of the second carriers injected into the light emitting layer 30 by the second carrier transport layer 50 per unit time. Taking the first carrier transport layer 40 being an electron transport layer and the second carrier transport layer 50 being a hole transport layer as an example, when a difference between the LUMO level of the first carrier transport layer 40 and the LUMO level of the light emitting layer 30 is low and a difference between the HOMO level of the second carrier transport layer 50 and the HOMO level of the light emitting layer 30 is great, a difficulty of injecting electrons into the light emitting layer 30 by the first carrier transport layer 40 is low and a difficulty of injecting holes into the light emitting layer 30 by the second carrier transport layer 50 is great, resulting in that the rate of injecting electrons into the light emitting layer 30 by the first carrier transport layer 40 is greater than the rate of injecting holes into the light emitting layer 30 by the second carrier transport layer 50.

The light emitting device further includes an interface layer 60, which is located on a side of the light emitting layer 30 close to the second carrier transport layer 50 and in contact with the light emitting layer 30. A material of the interface layer 60 includes a first material, and the first material in the interface layer 60 has the following characteristics: under a preset condition, the first material in the interface layer 60 may react with the first carrier, so that an energy level of the first material may be changed, and a transport rate of the first carrier in the interface layer 60 is less than a transport rate of the first carrier in the first carrier transfer layer. Therefore, the preset condition may be provided for the light emitting device, so that the first material in the interface layer 60 reacts with the first carrier, thereby reducing the number of the first carriers in the light emitting device, further facilitating the balance between holes and electrons in the light emitting device, and improving the performance and the lifetime of the light emitting device. Here, when the number of the first carriers in the light emitting device is reduced, it means that the transport rate of the first carriers in the interface layer 60 is less than the transport rate of the first carriers in the first carrier transport layer for a certain time.

Figure 3B:
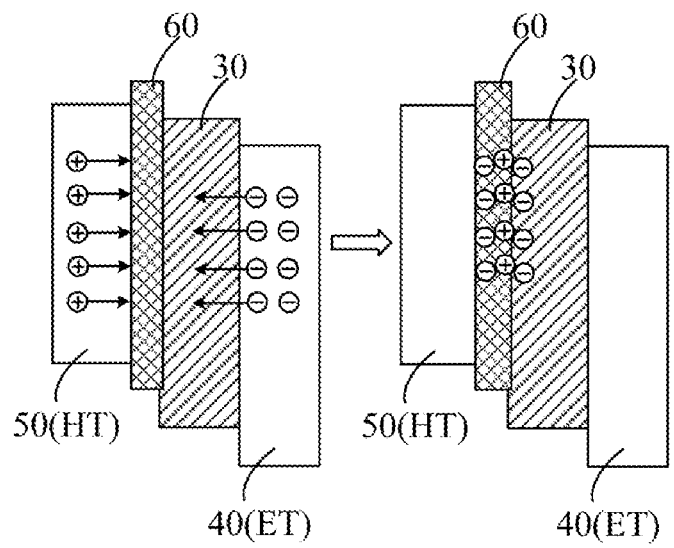
FIG. 3B is a schematic diagram illustrating a transport process in a light emitting device provided in some embodiments of the present disclosure.

FIG. 3B is a schematic diagram of a transport process in a light emitting device provided in some embodiments of the present disclosure, and FIG. 3C is a schematic diagram of an energy level of an interface layer provided in some embodiments of the present disclosure. FIG. 3B illustrates an example in which the first carrier transport layer 40 is an electron transport layer ET and the second carrier transport layer 50 is a hole transport layer HT. As shown in FIG. 3B, electrons and holes are injected from the electron transport layer ET and the hole transport layer HT, respectively, to the light emitting layer 30. When an excessive number of electrons pass through the light emitting layer 30 and are transported to the interface between the hole transport layer HT and the light emitting layer 30, the redundant electrons can interact with the first material, causing a reduction reaction of the first material, thereby consuming the redundant electrons, improving the balance degree between holes and electrons in the light emitting device, reducing the occurrence of Auger recombination in the light emitting device, and improving the current efficiency and the lifetime of the light emitting device.

In some embodiments, the preset condition includes being applied with a certain voltage or being excited by irradiation of a light in a specific wavelength band.

In some embodiments, the preset condition includes being applied with a certain voltage, and the first material in the interface layer 60 further satisfies the following characteristics: the first material is capable of undergoing a reverse change of energy level upon being applied with a certain reverse voltage. In this way, after the first material in the interface layer 60 reacts with the first carriers, it can be reduced to an initial state by being applied with a reverse voltage, thereby extending the lifetime of the light emitting device.

In some embodiments, the first material may include: at least one of viologen, polythiophene, polyaniline, phthalocyanine materials and fulvalene materials, or at least one of inorganic materials such as NiO, $WO_3$, $V_2O_5$ and $MoO_3$, or includes oxides and hydrated oxides of at least one element of platinum, iridium, osmium, palladium, ruthenium, rhodium, and the like.

Figure 4:
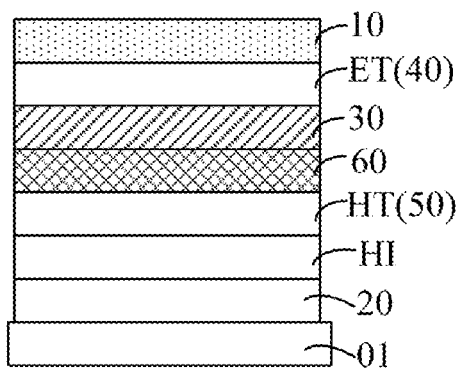
FIG. 4 is a schematic diagram of a first specific structure of a light emitting device provided in some embodiments of the present disclosure.

FIG. 4 is a schematic diagram of a specific structure of a light emitting device provided in some embodiments of the present disclosure. As shown in FIG. 4, in some embodiments, the light emitting device adopts a normal structure including a second electrode 20, a hole injection layer HI, a hole transport layer HT, an interface layer 60, a light emitting layer 30, an electron transport layer ET, and a first electrode 10, which are arranged in a direction away from a base substrate 01. The first electrode 10 is a cathode, the second electrode 20 is an anode, and the electron transport layer ET is a first carrier transport layer 40, which injects electrons into the light emitting layer 30 at a rate higher than a rate of injecting holes into the light emitting layer 30 by the hole transport layer HT.

In FIG. 4, the materials of the first electrode 10 and the second electrode 20 are not limited, for example, the second electrode 20 may be made of a transparent conductive material such as Indium Tin Oxide (ITO); the first electrode 10 may be made of a metal material, specifically one or more of Li, Ca, Ba, LiF, Ag, Mo, Al, Cu, and Au, but is not limited thereto. The material of the hole injection layer may include NiO or PEDOT:PSS, but is not limited thereto. The material of the hole transport layer HT may include one or more of TFB, NPB, TCTA, TPA, Poly-TPD, PEDOT:PSS, and the like, but is not limited thereto.

The first material in the interface layer may include at least one of viologen, polythiophene, tungsten trioxide ($WO_3$), molybdenum trioxide ($MoO_3$), vanadium pentoxide ($V_2O_5$), niobium oxide ($Nb_2O_5$), titanium dioxide ($TiO_2$), bismuth oxide ($BiO_3$), and the like.

The light emitting layer 30 may be a quantum dot light emitting layer, and the material thereof may be one or more selected from a group II-VI compound, a group III-V compound, and a group I-III-VI compound, but is not limited thereto. As an example, the group II-VI compound is selected from CdSe, CdS, CdTe, ZnSe, ZnS, CdTe, ZnTe, CdZnS, CdZnSe, CdZnTe, ZnSeS, ZnSeTe, ZnTeS, CdSeS, CdSeTe, CdTeS; CdZnSeS, CdZnSeTe and CdZnSTe; the group III-V compound is selected from one or more of InP, InAs, GaP, GaAs, GaSb, AlN, AlP, InAsP, InNP, InNSb, GaAlNP and InAlNP; and the group I-III-VI compound is selected from one or more of $CuInS_2$, $CuInSe_2$ and $AgInS_2$. Alternatively, the light emitting layer 30 may be an organic electroluminescent layer.

The material of the electron transport layer ET may be selected from one or more of ZnO, TiO2, $Alq_3$, SnO, ZrO, AlZnO, ZnSnO, BCP, TAZ, PBD, TPBi, Bphen and $CsCO_3$, but is not limited thereto.

Figure 5:
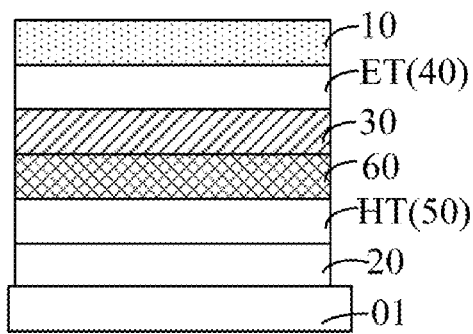
FIG. 5 is a schematic diagram of a second specific structure of a light emitting device provided in some embodiments of the present disclosure.

FIG. 5 is a schematic diagram of a second specific structure of a light emitting device provided in some embodiments of the present disclosure. The light emitting device shown in FIG. 5 is similar to FIG. 4, except that no hole injection layer is arranged in the light emitting device shown in FIG. 5. The materials of the other layers may refer to those described above for each layer in FIG. 4.

Figure 6:
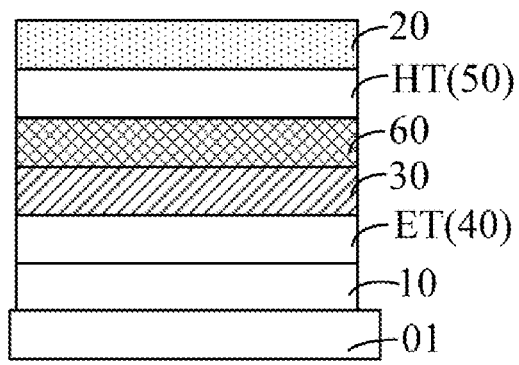
FIG. 6 is a schematic diagram of a third specific structure of a light emitting device provided in some embodiments of the present disclosure.

FIG. 6 is a schematic diagram of a third specific structure of a light emitting device provided in some embodiments of the present disclosure. The light emitting device shown in FIG. 6 is similar to that shown in FIG. 4, except that the light emitting device in FIG. 6 has an inverted structure. Specifically, in FIG. 6, the first carrier transport layer 40 is an electron transport layer ET, the second carrier transport layer 50 is a hole transport layer HT, the first electrode 10 is a cathode, the second electrode 20 is an anode, and the cathode, the electron transport layer ET, the light emitting layer 30, the interface layer 60, the hole transport layer HT and the anode are sequentially arranged in a direction away from the base substrate 01. In addition, unlike FIG. 4, in the light emitting device shown in FIG. 6, no hole injection layer is provided. The materials of the layers in FIG. 6 refer to those described above for each layer in FIG. 4.

Figure 7:
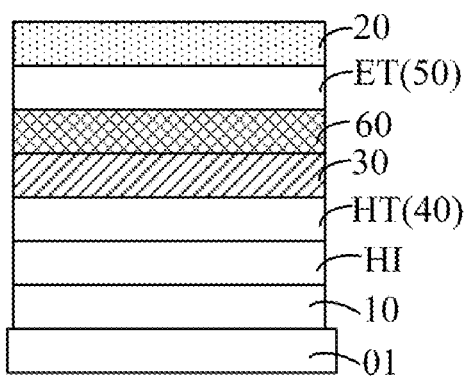
FIG. 7 is a schematic diagram of a fourth specific structure of a light emitting device provided in some embodiments of the present disclosure.

FIG. 7 is a schematic diagram of a fourth specific structural of a light emitting device provided in some embodiments of the present disclosure. As shown in FIG. 7, the light emitting device adopts a normal structure including a first electrode 10, a hole injection layer HI, a hole transport layer HT, a light emitting layer 30, an interface layer 60, an electron transport layer ET, and a second electrode 20 arranged in a direction away from a base substrate 01. In FIG. 7, the first electrode 10 is an anode, the second electrode 20 is a cathode, and the hole transport layer HT is a first carrier transport layer 40 which injects holes into the light emitting layer 30 at a rate higher than a rate of injecting electrons into the light emitting layer 30 by the electron transport layer ET.

In FIG. 7, the material of the anode may be made of ITO or other transparent conductive material; and the cathode may be made of a metal material, specifically one or more of Li, Ca, Ba, LiF, Ag, Mo, Al, Cu, and Au, but is not limited thereto.

The material of the hole injection layer HI may include PEDOT:PSS; the material of the hole transport layer HT may include PVK, the material of the electron transport layer ET may include TPBi, and the materials of the other layers refer to those described above for each layer in FIG. 4.

The interface layer includes an organic material and/or at least one of oxides and hydrated oxides of a group VIII metal element, as an inorganic material. The oxides of the group VIII metal element include, for example, oxides of at least one element of platinum, iridium, osmium, palladium, ruthenium, nickel, and rhodium. The organic material includes at least one of triphenylamines, fulvalenes, and the like.

Figure 8:
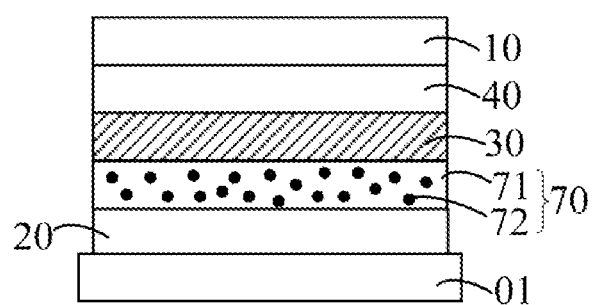
FIG. 8 is a schematic diagram of a fifth specific structure of a light emitting device provided in some embodiments of the present disclosure.

FIG. 8 is a schematic diagram of a fifth specific structure of a light emitting device provided in some embodiments of the present disclosure. In the light emitting device, the second carrier transport layer and the interface layer are formed into a one-piece structure. As shown in FIG. 8, the light emitting device includes a second electrode 20, a doped layer 70, a light emitting layer 30, a first carrier transport layer 40, and a first electrode 10, which are sequentially arranged in a direction away from a base substrate 01. The doped layer 70 is of a one-piece structure formed by the second carrier transport layer 50 and the interface layer 60, and includes a matrix 71 and a second carrier transport material 72 arranged in the matrix 71, where the material of the matrix 71 includes the first material capable of reacting with the first carrier under the preset condition.

Illustratively, the first carrier transport layer 40 is an electron transport layer, and the material thereof may refer to those described above for the electron transport layer in FIG. 4. The second carrier transport material 72 may be NiO nanoparticles, and the first material includes poly(3,4-ethylenedioxythiophene). Where the light emitting layer 30 is a quantum dot light emitting layer, the NiO nanoparticles have a certain fluorescence quenching effect on the quantum dot light emitting layer, and are dispersed in the matrix 71, so that the contact area between the NiO nanoparticles and the quantum dot light emitting layer can be reduced, thereby reducing the fluorescence quenching phenomenon.

Figure 9:
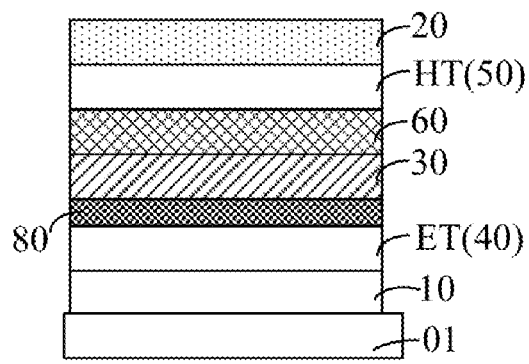
FIG. 9 is a schematic diagram of a sixth specific structure of a light emitting device provided in some embodiments of the present disclosure.

FIG. 9 is a schematic diagram of a sixth specific structure of a light emitting device provided in some embodiments of the present disclosure. The light emitting device shown in FIG. 9 is similar to that in FIG. 6, except that the light emitting device in FIG. 9 further includes a block layer 80, which is arranged between the light emitting layer 30 and the first carrier transport layer 40 for blocking the first carrier. That is, the block layer 80 may block majority carriers in the light emitting device, and the interface layer 60 may consume the majority carriers, thereby further improving a balancing effect on carriers in the light emitting device, and improving the current efficiency of the light emitting device.

Optionally, the first carrier transport layer 40 in FIG. 9 is an electron transport layer ET, and in this case, the block layer 80 is used to block a part of electrons injected into the light emitting layer 30 by the electron transport layer ET. Alternatively, the first carrier transport layer 40 is a hole transport layer HT, and in this case, the block layer 80 is used to block a part of holes injected into the light emitting layer 30 by the hole transport layer HT. The material of the block layer may be at least one selected from polymethyl methacrylate (PMMA), ethoxylated Polyethyleneimine (PEIE), aluminum oxide (Al2O3), and aluminum gallium nitride (AlGaN).

Optionally, a thickness of the block layer 80 is in a range of 1 nm to 10 nm, to improve the carrier balance degree. For example, the thickness of the block layer 80 is 1 nm, 3 nm, 5 nm, 7 nm, 9 nm, or 10 nm.

The light emitting device in FIG. 9 is described by taking an inverted structure as an example, but a normal structure may alternatively be adopted. In addition, a hole injection layer may be further arranged between the hole transport layer HT and the second electrode 20.

In general, materials capable of undergoing reversible redox reactions upon excitation by an electric field or light are electroluminescent or photoluminescent materials, even some of which are both electroluminescent and photoluminescent. Therefore, where the thickness of the interface layer 60 is too great, light of the light emitting layer 30 may be affected. For this reason, in the embodiments of the present disclosure, the thickness of the interface layer 60 is set to be in a range of 3 nm to 25 nm, and preferably, the thickness of the interface layer 60 is set to be in a range of 7 nm to 22 nm, so that the emission efficiency of the light emitting device can be improved, and the emission spectrum of the light emitting device can be prevented from being affected.

Figure 10:
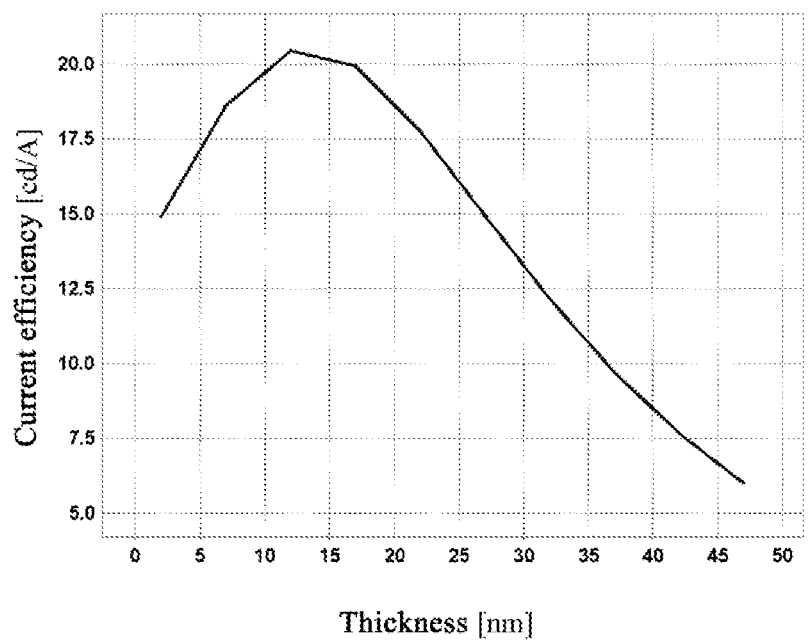
FIG. 10 is a graph illustrating a relationship between current efficiency and a thickness of an interface layer in a light emitting device provided in some embodiments of the present disclosure.
Figure 11:
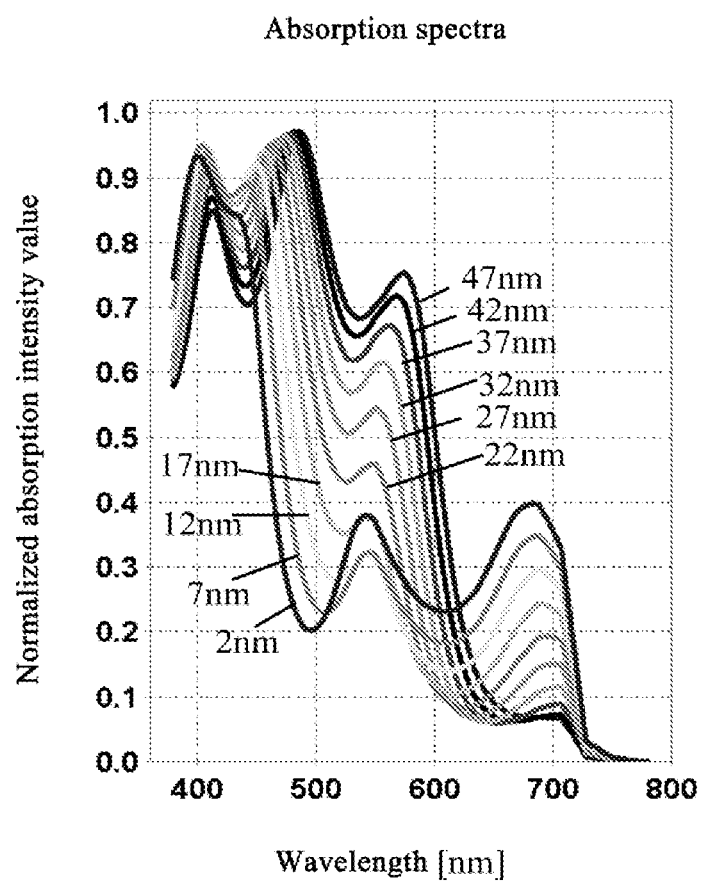
FIG. 11 is a graph illustrating absorption spectra of light emitting devices employing interface layers of different thicknesses provided in some embodiments of the present disclosure.
Figure 12:
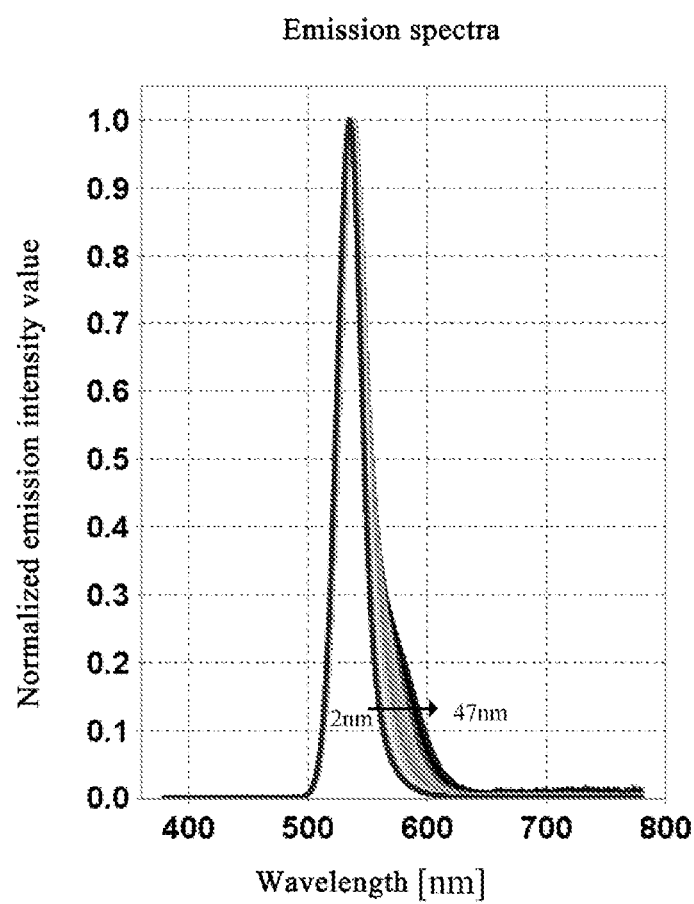
FIG. 12 is a graph illustrating emission spectra of light emitting devices employing interface layers of different thicknesses provided in some embodiments of the present disclosure.

FIG. 10 is a graph illustrating a relationship between current efficiency and a thickness of an interface layer in a light emitting device provided in some embodiments of the present disclosure, FIG. 11 is a graph illustrating absorption spectra of light emitting devices employing interface layers of different thicknesses provided in some embodiments of the present disclosure, and FIG. 12 is a graph illustrating emission spectra of light emitting devices employing interface layers of different thicknesses provided in some embodiments of the present disclosure, with the vertical axis in FIG. 11 representing normalized absorption intensity values and the vertical axis in FIG. 12 representing normalized emission intensity values. The structure of the light emitting device is shown in FIG. 4, and the material of the interface layer 60 includes viologen. The redox reaction process of the viologen is as follows: a stable state of the viologen in an initial state is a fully oxidized state, and the molecular formula is shown as formula 1; when the viologen is excited by an electric field, one to two electrons may be obtained, and the viologen is reduced. The molecular formula after obtaining one electron is shown as a formula 2, and the molecular formula after obtaining two electrons is shown as formula 3.

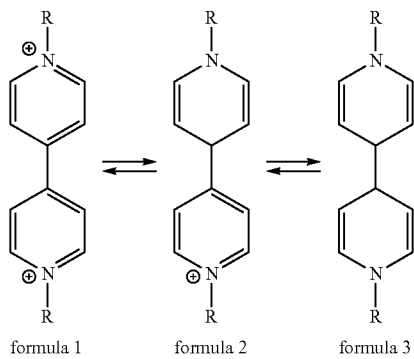

formula 1    formula 2    formula 3

$R = C_nH_{2n+1}$, $OC_nH_{2n+1}$, or other substituents

As can be seen from FIG. 11 to FIG. 12, when the thickness of the interface layer 60 is in a range of 3 nm to 25 nm, the current efficiency of the light emitting device is high, and when the thickness of the interface layer 60 is greater than 25 nm, the current efficiency of the light emitting device is significantly reduced. As can be seen from FIG. 11, for light in a wavelength range of 470 nm to 620 nm, the greater the thickness of the interface layer 60 is, the stronger the light absorption capability of the interface layer 60 is, i.e. an excessively thick layer may reduce the amount of light emitted by the light emitting device. Preferably, the thickness of the interface layer 60 is set within a range of 7 nm to 22 nm. As can be seen from FIG. 12, the emission peak will gradually become wider as the thickness of the interface layer 60 increases; when the thickness of the interface layer 60 exceeds 22 nm, the emission peak will be significantly broadened and smeared, and even a shoulder seam will occur, affecting the half-width of the emission peak and the color gamut of the light emitting device.

An embodiment of the present disclosure further provides a method of manufacturing a light emitting device, including: forming a first electrode, a second electrode, a light emitting layer, a first carrier transport layer and a second carrier transport layer. The first electrode and the second electrode are arranged opposite to each other, the light emitting layer is located between the first electrode and the second electrode, the first carrier transport layer is located between the first electrode and the light emitting layer, and the second carrier transport layer is located between the second electrode and the light emitting layer. One of the first carrier transport layer and the second carrier transport layer is an electron transport layer, and the other of the first carrier transport layer and the second carrier transport layer is a hole transport layer. A rate of injecting the first carriers into the light emitting layer by the first carrier transport layer is greater than a rate of injecting the second carriers into the light emitting layer by the second carrier transport layer.

In addition, the manufacturing method includes: forming an interface layer which is located on a side of the light emitting layer close to the second carrier transport layer and is in contact with the light emitting layer. A material of the interface layer includes a first material, which is capable of undergoing redox reactions upon being excited by an electric field or light irradiation, to consume the first carriers.

The following describes a method of manufacturing a light emitting device according to the present disclosure with reference to specific embodiments.

A First Embodiment

In this first embodiment, the structure of the light emitting device is as shown in FIG. 4, and includes a second electrode 20, a hole injection layer HI, a hole transport layer HT, an interface layer 60, a light emitting layer 30, an electron transport layer ET, and a first electrode 10, which are sequentially arranged in the direction away from the base substrate 01. The material of the second electrode 20 includes ITO, the material of the electron injection layer EI includes NiO, and the material of the hole transport layer HT as the second carrier transport layer includes TFB. The electron transport layer ET serves as a first carrier transport layer, and the material of the electron transport layer ET includes ZnO. The material of the interface layer 60 includes viologen. The light emitting layer 30 is a quantum dot light emitting layer, and the material of the first electrode 10 includes Ag.

The method of manufacturing the light emitting device in the first embodiment includes the following steps S11 to S18.

S11, forming a second electrode 20 on a base substrate 01, where a thickness of the second electrode 20 may be in a range of 80 nm to 130 nm, for example, 100 nm.

S12, cleaning the base substrate 01 with the second electrode 20 formed thereon, for example, through ultrasonic cleaning with water, ethanol, and acetone in this order each for 15 minutes, drying the base substrate 01 with a nitrogen gun, and then treating the base substrate 01 with ultraviolet ozone for 10 minutes.

S13, depositing a NiO precursor solution, and annealing at 275° C. in the air for 40 minutes, to obtain a NiO layer with a thickness of about 45 nm as a hole injection layer HI.

S14, forming a hole transport layer HT. TFB solution of 8 mg/ml may be deposited on the NiO layer and annealed at 135° C. for 20 minutes, to obtain a hole transport layer HT with a thickness of about 30 nm.

S15, depositing an acetonitrile solution of viologen of 4 mg/ml on the hole transport layer HT, to obtain an interface layer 60 with a thickness of about 8 nm.

S16, depositing a quantum dot solution of 10 mg/ml, and annealing at 120° C. for 10 minutes, to obtain a quantum dot light emitting layer with a thickness of about 25 nm.

S17, depositing ZnO solution of 30 mg/ml, and annealing at 120° C. for 10 minutes, to obtain an ZnO electron transport layer ET with a thickness of 45 nm.

S18, depositing a first electrode 10 of 100 nm.

A Second Embodiment

In this second embodiment, the structure of the light emitting device is as shown in FIG. 5, and includes a second electrode 20, a hole transport layer HT, an interface layer 60, a light emitting layer 30, an electron transport layer ET, and a first electrode 10, sequentially arranged in the direction away from the base substrate 01. The material of the second electrode 20 includes ITO, and the material of the hole transport layer HT serves as a second carrier transport layer and includes PEDOT:PSS. The electron transport layer ET serves as a first carrier transport layer, and the material thereof includes Bphen. The material of the interface layer 60 includes WO$_3$. The light emitting layer 30 is an organic electroluminescent layer, and the material thereof includes NPB:Alq3, and the material of the first electrode 10 includes a metal lamination of LiF and Al.

The method of manufacturing a light emitting device in the second embodiment includes the following steps S21 to S27.

S21, forming a second electrode 20 on a base substrate 01, where a thickness of the second electrode 20 may be in a range of 80 nm to 130 nm, for example, 100 nm.

S22, cleaning the base substrate 01 with the second electrode 20 formed thereon, for example, through ultrasonic cleaning with water, ethanol, and acetone in this order each for 15 minutes, drying it with a nitrogen gun, and then treating it with ultraviolet ozone for 10 minutes.

S23, depositing a PEDOT:PSS solution, and annealing at 150° C. in the air for 20 minutes, to obtain a hole transport layer HT with a thickness of about 45 nm.

S24, depositing the interface layer 60 of 10 nm on the hole transport layer HT, through vacuum evaporation.

S25, co-depositing an NPB material and an Alq3 material through vacuum evaporation, to form the light emitting layer 30.

S26, depositing Bphen through vacuum evaporation, to form the electron transport layer ET.

S27, forming a LiF layer of 0.7 nm and an Al layer of 100 nm, as the first electrode 10. Both of the LiF layer and the Al layer maybe formed through evaporation.

A Third Embodiment

In this third embodiment, the structure of the light emitting device is shown in FIG. 6, and includes a first electrode 10, an electron transport layer ET, a light emitting layer 30, an interface layer 60, a hole transport layer HT and a second electrode 20, which are sequentially arranged in the direction away from the base substrate 01. The material of the first electrode 10 includes ITO. The electron transport layer ET serves as a first carrier transport layer, and the material thereof includes ZnO. The hole transport layer HT serves as a second carrier transport layer, and the material thereof includes TCTA and NPB. The light emitting layer 30 is a quantum dot light emitting layer. The material of interface layer 60 includes 1,8-diethyl viologen, which has the following formula:

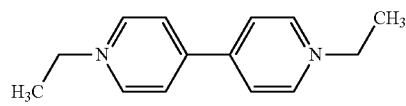

The method of manufacturing a light emitting device in the third embodiment includes the following steps S31 to S36.

S31, forming a first electrode 10 on a base substrate 01, where a thickness of the first electrode 10 may be in a range of 80 nm to 130 nm, for example, 100 nm.

S32, cleaning the base substrate 01 with the first electrode 10 formed thereon, for example, through ultrasonic cleaning with water, ethanol, and acetone in this order each for 15 minutes, drying it with a nitrogen gun, and then treating it with ultraviolet ozone for 10 minutes.

S33, depositing a ZnO solution of 30 mg/ml, and annealing at 120° C. for 10 minutes, to obtain the electron transport layer ET.

S34, depositing a quantum dot solution of 10 mg/ml, and annealing at 120° C. for 10 minutes, to obtain a quantum dot light emitting layer.

S35, depositing a acetonitrile solution of 1,8-diethylviologen of 3 mg/ml, to form the interface layer 60 with a thickness of about 4 nm.

S36, depositing a TCTA layer and an NPB layer through vapor deposition, to form the hole transport layer HT.

S37, depositing a metal layer of Ag, as the second electrode 20.

A Fourth Embodiment

The light emitting device in this fourth embodiment is similar to the light emitting device in the third embodiment, except that the material of the interface layer, the material of the hole transport layer, and the material of the second electrode are different from those in the third embodiment.

The manufacturing method of the light emitting device in the fourth embodiment is similar to that in the third embodiment, except that when the interface layer is formed, a MoO3 layer of 5 nm is deposited as the interface layer; when the hole transport layer HT is formed, a poly-TPD layer and a TPA (phosphotungstic acid) layer are formed, as the hole transport layer HT; and when the second electrode 20 is formed, Mg metal and Ag metal are co-evaporated, to form Mg:Ag alloy layer as the second electrode 20.

A Fifth Embodiment

The light emitting device in this fifth embodiment has a structure as shown in FIG. 7, and includes a first electrode 10, a hole injection layer HI, a hole transport layer HT, a light emitting layer 30, an interface layer 60, an electron transport layer ET, and a second electrode 20, which are sequentially arranged in the direction away from a base substrate 01. The material of the first electrode 10 includes ITO, the material of the second electrode 20 includes LiF and Al, and the material of the hole injection layer HI includes PEDOT:PSS. The hole transport layer HT serves as a first carrier transport layer, and the material thereof includes PVK; the electron transport layer ET serves as a second carrier transport layer, and includes TPBi. The light emitting layer 30 is a quantum dot light emitting layer. The material of the interface layer 60 includes 4-cyano-dithiophene triphenylamine, which has the following molecular formula:

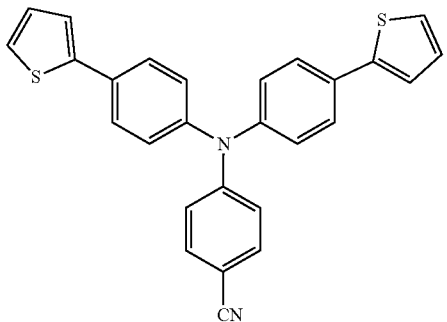 [SMILES: N#Cc1ccc(N(c2ccc(-c3cccs3)cc2)c2ccc(-c3cccs3)cc2)cc1]

The method of manufacturing a light emitting device in a fifth embodiment includes the following steps S51 to S58.

S51, forming a first electrode 10 on a base substrate 01, where a thickness of the first electrode 10 may be in a range of 80 nm to 130 nm, for example, 100 nm.

S52, cleaning the base substrate 01 with the first electrode 10 formed thereon, for example, through ultrasonic cleaning with water, ethanol, and acetone in this order each for 15 minutes, drying it with a nitrogen gun, and then treating it with ultraviolet ozone for 10 minutes.

S53, depositing a PEDOT PSS solution, and annealing at 150° C. in the air for 20 minutes, to obtain the hole injection layer HI with a thickness of about 45 nm.

S54, depositing a PVK solution of 8 mg/ml, and annealing at 135° C. for 20 minutes, to obtain the hole transport layer HT with a thickness of about 30 nm.

S55, depositing a quantum dot solution of 15 mg/ml, and annealing at 120° C. for 10 minutes, to obtain the light emitting layer 30 with a thickness of about 30 nm.

S56, dissolving 4-cyano-dithiophene triphenylamine in acetonitrile to form a solution with a concentration of about 5 mg/ml, and spin-coating the solution on the light emitting layer 30, to obtain the interface layer 60 with a thickness of about 6 nm.

S57, evaporating a TPBi layer of 30 nm through an evaporation method, to form the electron transport layer ET.

S58, depositing a LiF layer of 1 nm and an Al layer of 100 nm, as the second electrode 20.

A Sixth Embodiment

The light emitting device in this sixth embodiment has a structure as shown in FIG. 8, and includes a second electrode 20, a doped layer 70, a light emitting layer 30, a first carrier transport layer 40, and a first electrode 10, which are sequentially arranged in the direction away from the base substrate 01. The doped layer 70 includes a matrix and a second carrier transport material 72 doped in the matrix 71. The material of the matrix 71 includes poly(3,4-ethylenedioxythiophene), and the second carrier transport material 72 includes NiO. The first carrier transport layer 40 is an electron transport layer.

The method of manufacturing a light emitting device in the sixth embodiment includes the following steps S61 to S66.

S61, forming a second electrode 20 on a base substrate 01, where the material of the second electrode 20 is ITO, and a thickness of the second electrode 20 may be in a range of 80 nm to 130 nm, for example, 100 nm.

S22, cleaning the base substrate 01 with the second electrode 20 formed thereon, for example, through ultrasonic cleaning with water, ethanol, and acetone in this order each for 15 minutes, drying the base substrate 01 with a nitrogen gun, and then treating the base substrate 01 with ultraviolet ozone for 10 minutes.

S63, mixing an aqueous solution of poly(3,4-ethylenedioxythiophene) and an ethanol solution of NiO nano-particles according to a certain proportion, and stirring the mixed solution for 2 hours, to fully and uniformly mix the mixed solution; then depositing the mixed solution on the second electrode 20, and annealing at 150° C. in air, to obtain the doped layer 70 with a thickness of about 50 nm.

S64, depositing a quantum dot solution with a concentration of, for example, 10 mg/ml; and annealing at 120° C. for 10 minutes, to obtain the quantum dot light emitting layer.

S65, depositing a ZnO solution with a concentration of, for example, 30 mg/ml; and annealing at 120° C. for 10 minutes, to obtain the electron transport layer ET.

S66, depositing an aluminum metal layer of 100 nm, as the first electrode 10.

An embodiment of the present disclosure further provides a display substrate, including a plurality of light emitting devices arranged on a base substrate. At least one light emitting device employs the light emitting device in the above-described embodiment.

In some embodiments, the display substrate has a plurality of pixel regions, each having one light emitting device of the above embodiments therein. The plurality of light emitting devices of the display substrate may include a red light emitting device, a green light emitting device, and a blue light emitting device. For light emitting devices of different colors, HOMO energy levels of light emitting layers are different, and difficulties of hole injection are different, so that carriers imbalance degrees in the light emitting devices of different colors are different. Therefore, the thicknesses and the materials of the interface layers in the light emitting devices with different colors may be adjusted, so that the carrier balance degrees of the light emitting devices with different colors can be the same or similar.

The thicknesses of the interface layers in the red light emitting device, the green light emitting device and the blue light emitting device are different from each other; and/or the materials of the interface layers in the red light emitting device, the green light emitting device and the blue light emitting device are different from each other.

An embodiment of the present disclosure further provides a display apparatus, which includes the display substrate describe above.

The display apparatus may be any product or component having a display function, such as an electronic paper, a QLED panel, an OLED panel, a mobile phone, a tablet computer, a television, a monitor, a notebook computer, a digital photo frame, a navigator, or the like.

It will be understood that the above embodiments are merely exemplary embodiments adopted to illustrate the principles of the present disclosure, and the present disclosure is not limited thereto. It will be apparent to one of ordinary skill in the art that various changes and modifications can be made without departing from the spirit and scope of the present disclosure, and these changes and modifications are to be considered within the scope of the present disclosure.

What is claimed is:

1. A light emitting device, comprising a first electrode, a second electrode, a light emitting layer, a first carrier transport layer and a second carrier transport layer, wherein the first electrode and the second electrode are opposite to each other, the light emitting layer is between the first electrode and the second electrode, the first carrier transport layer is between the first electrode and the light emitting layer, and the second carrier transport layer is between the second electrode and the light emitting layer; one of the first carrier transport layer and the second carrier transport layer is an electron transport layer, and the other of the first carrier transport layer and the second carrier transport layer is a hole transport layer; a rate of injecting first carriers into the light emitting layer by the first carrier transport layer is greater than a rate of injecting second carriers into the light emitting layer by the second carrier transport layer; and the light emitting device further comprises an interface layer on a side of the light emitting layer close to the second carrier transport layer and in contact with the light emitting layer; a material of the interface layer comprises a first material, which is capable of reacting with the first carriers under a preset condition, such that an energy level of the first material is changeable; and a transport rate of the first carriers in the interface layer is less than a transport rate of the first carriers in the first carrier transport layer.

2. The light emitting device according to claim 1, wherein the preset condition comprises being applied with a voltage or being excited by irradiation of a light in a wavelength band.

3. The light emitting device according to claim 2, wherein the preset condition comprises being applied with the voltage; and the first material is capable of undergoing a reverse change of energy level upon being applied with a reverse voltage.

4. The light emitting device according to claim 1, wherein the interface layer has a thickness in a range of 3 nm to 25 nm.

5. The light emitting device according to claim 1, wherein the first carriers are electrons, the second carriers are holes, and a material of the interface layer comprises at least one of viologen, polythiophene, tungsten trioxide, molybdenum trioxide, vanadium pentoxide, niobium oxide, titanium dioxide, and bismuth oxide.

6. The light emitting device according to claim 1, wherein the first carriers are holes, the second carriers are electrons, and a material of the interface layer comprises at least one of oxides and hydrated oxides of a group VIII metal element, and/or at least one of organic materials of triphenylamines and fulvalene.

7. The light emitting device according to claim 1, wherein the interface layer is between the second carrier transport layer and the light emitting layer; or the interface layer and the second carrier transport layer are formed into a doped layer, the doped layer comprises a matrix and a second carrier transport material doped in the matrix, and a material of the matrix comprises the first material.

8. The light emitting device according to claim 7, wherein the first material comprises poly(3,4-ethylenedioxythiophene), and the second carrier transport material comprises NiO nanoparticles.

9. The light emitting device according to claim 1, wherein the light emitting layer is an organic electroluminescent layer or a quantum dot light emitting layer.

10. A display substrate, comprising a plurality of light emitting devices, at least one of which is the light emitting device according to claim 1.

11. A display substrate, comprising a plurality of light emitting devices, each of which is the light emitting device according to claim 1, wherein the plurality of light emitting devices comprises a red light emitting device, a green light emitting device, and a blue light emitting device, wherein
thicknesses of the interface layers in the red light emitting device, the green light emitting device and the blue light emitting device are different from each other; and/or
materials of the interface layers in the red light emitting device, the green light emitting device and the blue light emitting device are different from each other.

12. A method of manufacturing a light emitting device, comprising:
forming a first electrode, a second electrode, a light emitting layer, a first carrier transport layer and a second carrier transport layer, wherein the first electrode and the second electrode are opposite to each other, the light emitting layer is between the first electrode and the second electrode, the first carrier transport layer is between the first electrode and the light emitting layer, and the second carrier transport layer is between the second electrode and the light emitting layer; one of the first carrier transport layer and the second carrier transport layer is an electron transport layer, and the other of the first carrier transport layer and the second carrier transport layer is a hole transport layer; a rate of injecting first carriers into the light emitting layer by the first carrier transport layer is greater than a rate of injecting second carriers into the light emitting layer by the second carrier transport layer; and
the method further comprises: forming an interface layer on a side of the light emitting layer close to the second carrier transport layer and in contact with the light emitting layer, wherein a material of the interface layer comprises a first material, which is capable of reacting with the first carriers under a preset condition, such that an energy level of the first material is changeable; and a transport rate of the first carriers in the interface layer is less than a transport rate of the first carriers in the first carrier transport layer.

13. A display apparatus, comprising the display substrate according to claim 10.

14. A display apparatus, comprising the display substrate according to claim 11.

15. The display substrate according to claim 10, wherein the preset condition comprises being applied with a voltage or being excited by irradiation of a light in a wavelength band.

16. The display substrate according to claim 15, wherein the preset condition comprises being applied with the voltage; and
the first material is capable of undergoing a reverse change of energy level upon being applied with a reverse voltage.

17. The display substrate according to claim 10, wherein the interface layer has a thickness in a range of 3 nm to 25 nm.

18. The display substrate according to claim 10, wherein the first carriers are electrons, the second carriers are holes, and a material of the interface layer comprises at least one of viologen, polythiophene, tungsten trioxide, molybdenum trioxide, vanadium pentoxide, niobium oxide, titanium dioxide, and bismuth oxide.

19. The display substrate according to claim 10, wherein the first carriers are holes, the second carriers are electrons, and a material of the interface layer comprises at least one of oxides and hydrated oxides of a group VIII metal element, and/or at least one of organic materials of triphenylamines and fulvalene.

20. The display substrate according to claim 10, wherein the light emitting layer is an organic electroluminescent layer or a quantum dot light emitting layer.

* * * * *